US010497598B2

(12) United States Patent
Cooke et al.

(10) Patent No.: US 10,497,598 B2
(45) Date of Patent: Dec. 3, 2019

(54) ELECTROSTATIC CHUCK AND METHOD OF MAKING SAME

(71) Applicant: Entegris, Inc., Billerica, MA (US)

(72) Inventors: Richard A. Cooke, Framingham, MA (US); Wolfram Neff, Woburn, MA (US); Carlo Waldfried, Middleton, MA (US); Jakub Rybczynski, Arlington, MA (US); Michael Hanagan, Grafton, MA (US); Wade Krull, Marblehead, MA (US)

(73) Assignee: ENTEGRIS, INC., Billerica, MA (US)

( * ) Notice: Subject to any disclaimer, the term of this patent is extended or adjusted under 35 U.S.C. 154(b) by 485 days.

(21) Appl. No.: 15/111,591

(22) PCT Filed: Feb. 6, 2015

(86) PCT No.: PCT/US2015/014810
§ 371 (c)(1),
(2) Date: Jul. 14, 2016

(87) PCT Pub. No.: WO2015/120265
PCT Pub. Date: Aug. 13, 2015

(65) Prior Publication Data
US 2016/0336210 A1 Nov. 17, 2016

Related U.S. Application Data

(60) Provisional application No. 61/937,135, filed on Feb. 7, 2014.

(51) Int. Cl.
H01L 21/683 (2006.01)
H01L 21/67 (2006.01)

(52) U.S. Cl.
CPC .... H01L 21/6833 (2013.01); H01L 21/67248 (2013.01); H01L 21/6831 (2013.01)

(58) Field of Classification Search
CPC .. H01L 21/6833; H01L 21/6831–6833; H01N 13/00
See application file for complete search history.

(56) References Cited

U.S. PATENT DOCUMENTS 5,909,355 A 6/1999 Parkhe
6,272,002 B1 8/2001 Mogi et al.
(Continued)

FOREIGN PATENT DOCUMENTS

JP H10-154596 A 6/1998
JP 2001-525617 A 12/2001
(Continued)

OTHER PUBLICATIONS

International Search Report and Written Opinion for Int'l Application No. PCT/US2015/014810, titled: Electrostatic Chuck and Method of Making Same, dated Apr. 21, 2015.

Primary Examiner — Ronald W Leja
Assistant Examiner — Christopher J Clark
(74) Attorney, Agent, or Firm — Entegris, Inc.

(57) ABSTRACT

An electrostatic chuck includes a ceramic structural element, at least one electrode disposed on the ceramic structural element, and a surface dielectric layer disposed over the at least one electrode, the surface layer activated by a voltage in the electrode to form an electric charge to electrostatically clamp a substrate to the electrostatic chuck. The surface dielectric layer comprises: (i) an insulator layer of amorphous alumina, of a thickness of less than about 5 microns, disposed over the at least one electrode; and (ii) a stack of dielectric layers disposed over the insulator layer. The stack of dielectric layers includes: (a) at least one dielectric layer including aluminum oxynitride; and (b) at least one dielectric layer including at least one of silicon oxide and silicon oxynitride.

64 Claims, 5 Drawing Sheets

(56) References Cited

U.S. PATENT DOCUMENTS

| | | | |
|---|---|---|---|
| 7,364,624 B2 | 4/2008 | Mariner et al. | |
| 2008/0151467 A1 | 6/2008 | Simpson | |
| 2009/0242544 A1 | 10/2009 | Kano | |
| 2010/0003510 A1 | 1/2010 | Kano et al. | |
| 2012/0024449 A1* | 2/2012 | Ricci | C23C 16/4404 156/60 |
| 2012/0141661 A1 | 6/2012 | Cho et al. | |
| 2017/0098568 A1 | 4/2017 | Cooke | |
| 2017/0229327 A1* | 8/2017 | Singh | H01L 21/67103 |

FOREIGN PATENT DOCUMENTS

| | | |
|---|---|---|
| JP | 2003-309168 A | 10/2003 |
| JP | 2005-093723 A | 4/2005 |
| JP | 2006-517740 A | 7/2006 |
| JP | 2010-258280 A | 11/2010 |
| JP | 2011-521470 A | 7/2011 |
| TW | 201120988 | 6/2011 |
| WO | WO 2007/005925 A1 | 1/2007 |
| WO | 2007/043519 A1 | 4/2007 |
| WO | WO 2010/132640 A2 | 11/2010 |
| WO | WO 2011/149918 A2 | 12/2011 |
| WO | WO 2012/033922 A2 | 3/2012 |
| WO | 2015/120265 A1 | 8/2015 |

* cited by examiner

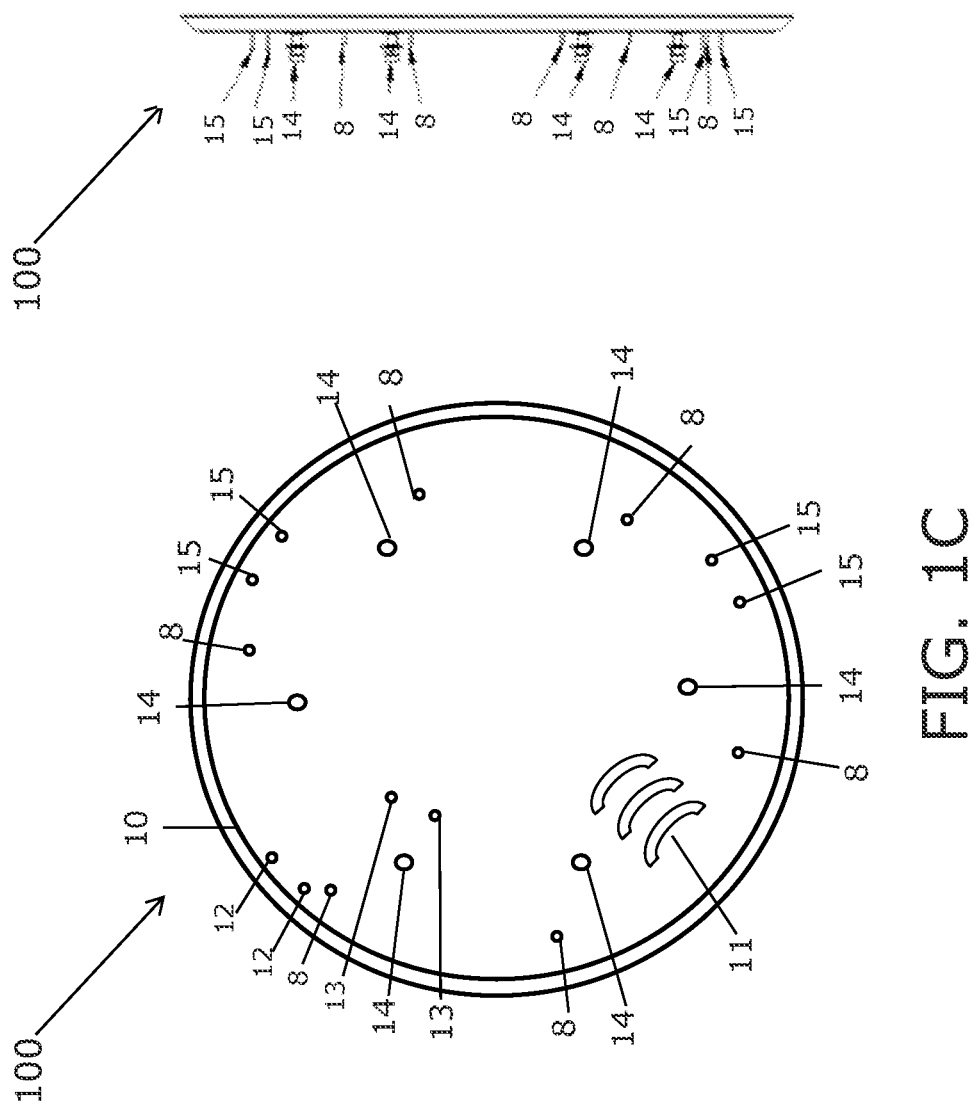

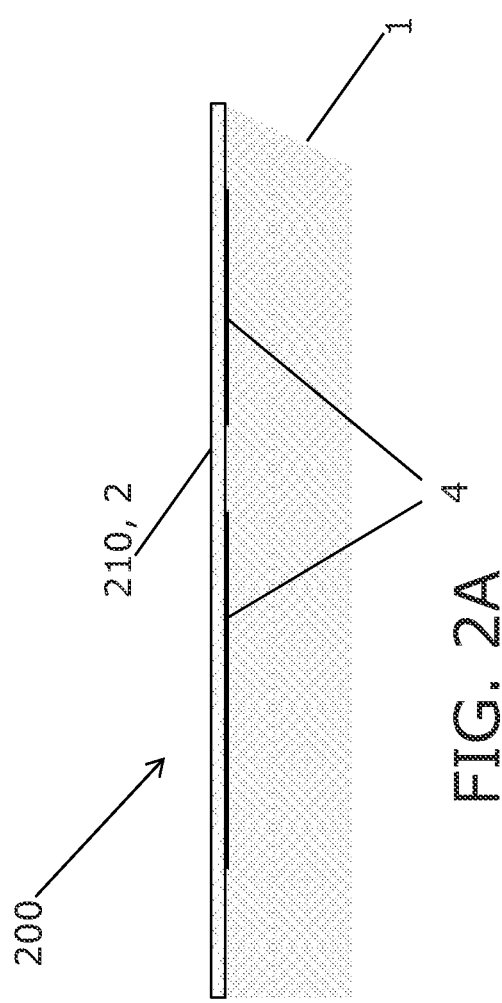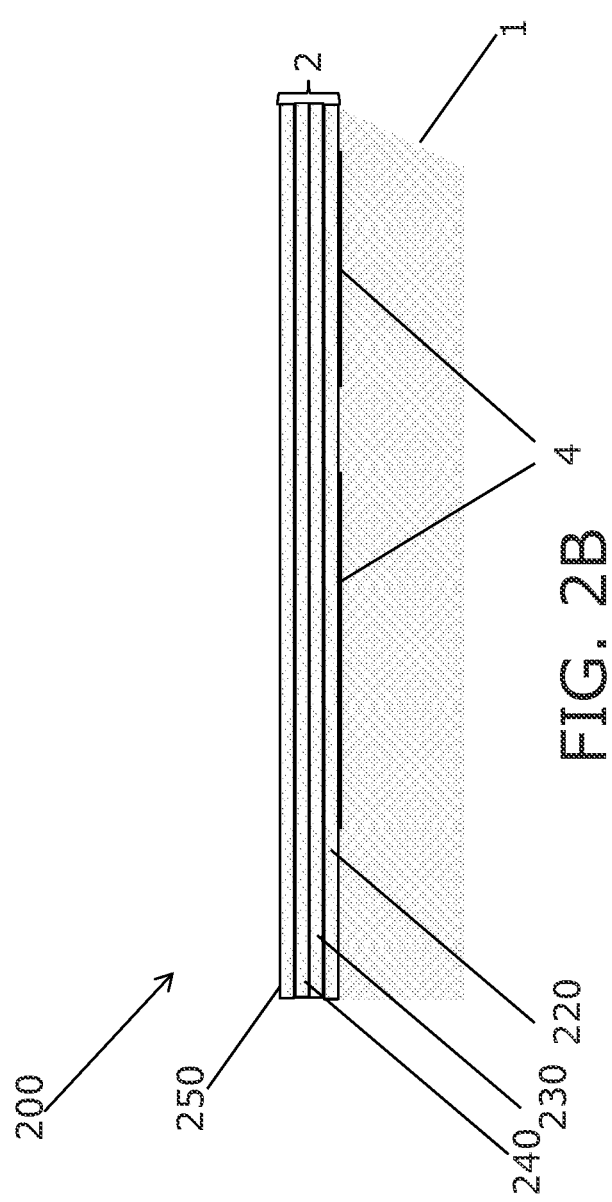

ELECTROSTATIC CHUCK AND METHOD OF MAKING SAME

RELATED APPLICATION

This application is the U.S. National Stage of International Application No. PCT/US2015/014810, filed on Feb. 6, 2015, which designates the U.S., published in English, and claims the benefit of U.S. Provisional Application No. 61/937,135, filed on Feb. 7, 2014. The entire teachings of the above application(s) are incorporated herein by reference.

BACKGROUND OF THE INVENTION

Electrostatic chucks (ESCs) are often utilized in the semiconductor manufacturing industry for clamping workpieces or substrates into a fixed position on a support surface during plasma-based or vacuum-based semiconductor processes such as ion implantation, etching, chemical vapor deposition (CVD), etc. Electrostatic clamping capabilities of these ESCs, as well as workpiece temperature control and high temperature operation (i.e., operation in a range of between about 400° C. and about 750° C., such as at a temperature of about 500° C.), have proven to be quite valuable in processing semiconductor substrates, workpieces or wafers, such as silicon wafers.

An electrostatic chuck generally includes an insulator body, such as a ceramic (e.g., alumina, or the like) body, having an embedded electrode for generating chucking force. The electrode is typically embedded by forming the ceramic body from two pieces, coating the electrode onto one piece, and then bonding the two pieces together using an adhesive. Even high temperature adhesives, however, typically fail at temperatures higher than about 250° C.

Therefore, there is a need for an improved chuck design that reduces or eliminates the problems described above.

SUMMARY OF THE INVENTION

The invention generally is directed to an electrostatic chuck having a dielectric layer deposited onto an insulator body.

In one version, an electrostatic chuck includes a ceramic structural element, at least one electrode disposed on the ceramic structural element, and a surface dielectric layer disposed over the at least one electrode, the surface dielectric layer activated by a voltage in the electrode to form an electric charge to electrostatically clamp a substrate to the electrostatic chuck. The surface dielectric layer comprises: (i) an insulator layer of amorphous alumina, of a thickness of less than about 5 microns, disposed over the at least one electrode; and (ii) a stack of dielectric layers disposed over the insulator layer. The stack of dielectric layers includes: (a) at least one dielectric layer including aluminum oxynitride; and (b) at least one dielectric layer including at least one of silicon oxide and silicon oxynitride.

In some versions, the ceramic structural element can include alumina. In some other versions, the ceramic structural element can include aluminum nitride. In yet other versions, the ceramic structural element can include silicon nitride. In certain versions, the electrode includes at least one of: aluminum, titanium, molybdenum, silver, platinum, gold, nickel, tungsten, chromium, vanadium, ruthenium, iron, palladium, Kovar® (Kovar® is a registered U.S. Trademark of CRS Holdings, Inc., a subsidiary of Carpenter Technology Corporation of Wyomissing, Pa., U.S.A.) or other nickel-cobalt ferrous alloy, manganese, and a nitride, such as titanium nitride. The at least one electrode can comprise a thickness of less than about 0.5 microns, such as less than about 0.25 microns. The electrostatic chuck can further comprise a heater. The heater can include a resistive heater that is deposited and encapsulated at a rear side of the ceramic structural element. The electrostatic chuck can further comprise at least one embedded temperature sensor.

The surface dielectric layer can have a thickness in a range of between about 1 µm and about 250 µm. In some versions, the insulator layer of amorphous alumina is deposited by atomic layer deposition over the at least one electrode. The insulator layer can have a thickness in a range of between about 0.5 µm and about 2 µm, such as about 1 µm. In certain versions, the stack of dielectric layers can include a first dielectric layer deposited over the insulator layer, the first dielectric layer including silicon oxide, a second dielectric layer deposited over the first dielectric layer, the second dielectric layer including aluminum oxynitride, and a third dielectric layer deposited over the second dielectric layer, the third dielectric layer including silicon oxide. In these specific versions, the thickness of the first dielectric layer can be in a range of between about 10 µm and about 50 µm, such as about 20 µm, the thickness of the second dielectric layer can be in a range of between about 1 µm and about 20 µm, such as about 10 µm, and the thickness of the third dielectric layer can be in a range of between about 10 µm and about 50 µm, such as about 20 µm. In some versions, the surface dielectric layer can include at least one of yttria and zirconia. In some other versions, the surface dielectric layer can include silicon nitride.

In some versions, the stack of dielectric layers can include: a first dielectric layer disposed over the insulator layer, the first dielectric layer including aluminum oxynitride; and a second dielectric layer disposed over the first dielectric layer, the second dielectric layer including at least one of silicon oxide and silicon oxynitride. In these specific versions, the thickness of the first dielectric layer can be about 10 µm; and the second dielectric layer can have a thickness in a range of between about 40 µm and about 50 µm. A substrate contacting surface of the electrostatic chuck can comprise a plurality of protrusions extending to a height above portions of the substrate contacting surface of the electrostatic chuck surrounding the plurality of protrusions. The plurality of protrusions can comprise a height of between about 3 microns and about 15 microns, such as a height of between about 6 microns and about 8 microns. The plurality of protrusions can comprise at least one of etched protrusions and deposited protrusions. At least one protrusion of the plurality of protrusions can comprise a substrate contacting surface coating, such as alumina deposited by atomic layer deposition, over an underlying protrusion.

In other versions, the electrostatic chuck can comprise a diffusion barrier layer of amorphous alumina, deposited by atomic layer deposition, disposed over the stack of dielectric layers. The diffusion barrier layer can have a thickness in a range of between about 0.2 µm and about 1 µm. A plurality of protrusions, such as protrusions including silicon oxide, can be deposited over the diffusion barrier layer.

In some versions, the insulator layer of amorphous alumina can have a minimum dielectric strength of at least about 200 V per micron; such as between about 200 V per micron and about 400 V per micron; or of at least about 500 V per micron; or of at least about 800 V per micron. The at least one dielectric layer including aluminum oxynitride can comprise a minimum dielectric strength of at least about 50 V per micron. The at least one dielectric layer including at least one of silicon oxide and silicon oxynitride can comprise silicon oxide comprising a minimum dielectric strength of at least about 70 V per micron; and can comprise silicon oxynitride comprising a minimum dielectric strength of at least about 70 V per micron.

In another version, the surface dielectric layer can be comprised of one or more electrically insulating layers. At least one electrically insulating layer can be deposited with the thin film deposition technique of atomic layer deposition. In some versions, at least on electrically insulating layer can be deposited with a thin film deposition technique such as chemical vapor deposition, plasma enhanced chemical vapor deposition, physical vapor deposition, electron beam deposition, spray coating, atmospheric plasma deposition, high pressure plasma deposition, electrochemical deposition, sputter deposition, and any combination thereof. The surface dielectric layer can be comprised of materials such as alumina, aluminum-oxy nitride, aluminum nitride, silicon oxide, silicon-oxy-nitride, silicon nitride, a transition metal oxide, a transition metal oxy-nitride, a rare earth oxide, a rare earth oxy-nitride, and any combination thereof. The surface dielectric layer can be comprised of one or more class of materials selected from the group consisting of a polycrystalline thin film, an amorphous thin film, and a quasi-crystalline thin film. The surface dielectric layer can be conformal. The surface dielectric layer can have a thickness between 1 micron and 250 microns, such as between 10 microns and 70 microns, or between 25 microns and 50 microns. The surface dielectric layer can have the ability to hold an electrical peak voltage of more than 500V, such as more than 1000V, that is applied between the top and bottom of the surface dielectric layer. The surface dielectric layer can be stable at temperatures between −150° C. and +750° C. The surface dielectric layer can fulfill the function of at least one of: (1) high strength dielectric barrier, (2) dielectric layer with inherently low metals contamination and low particle source, (3) a plasma etch resistant surface, (4) an abrasion resistant surface.

In some versions, the electrostatic chuck can comprise a rounded edge on at least one of: a gas hole; a gas channel; a lift pin hole; and a ground pin hole. A substrate contacting surface of the electrostatic chuck can comprise at least one of: alumina deposited by atomic layer deposition, silicon oxide, silicon nitride, silicon oxynitride and silicon-rich oxide. The insulator layer of amorphous alumina can comprise a porosity of less than about 2 volume percent, such as less than about 1 volume percent, such as less than about 0.5 volume percent. The insulator layer of amorphous alumina can comprise alumina of formula $Al_xO_y$, where x is in the range of 1.8 to 2.2 and y is in the range of 2.6 to 3.4. The at least one dielectric layer including aluminum oxynitride can comprise aluminum oxynitride of formula $AlO_xN_y$, where x is in the range of 1.4 to 1.8 and y is in the range of 0.2 to 0.5. The at least one dielectric layer including at least one of silicon oxide and silicon oxynitride can comprise silicon oxide of formula $SiO_x$, where x is in the range of 1.8 to 2.4. The at least one dielectric layer including at least one of silicon oxide and silicon oxynitride can comprises silicon oxynitride of formula $SiO_xN_y$, where x is in the range of 1.6 to 2.0 and y is in the range of 0.1 to 0.5.

In yet another version, a method of making an electrostatic chuck includes disposing at least one electrode onto a ceramic structural element, and depositing a surface dielectric layer over the at least one electrode, the surface dielectric layer activated by a voltage in the electrode to form an electric charge to electrostatically clamp a substrate to the electrostatic chuck. The electrode, ceramic structural element, and surface dielectric layer are as described above.

This invention has many advantages, such as enabling high temperature processing of semiconductor substrates.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIG. 1C is a rear view of an electrostatic chuck in accordance with one version of the invention.

FIG. 2A is a schematic illustration of an electrostatic chuck having a surface dielectric layer in accordance with one version of the invention.

FIG. 2B is a schematic illustration of an electrostatic chuck having a surface dielectric layer that includes an insulator layer over the at least one electrode and a stack of three dielectric layers over the insulator layer in accordance with one version of the invention.

DETAILED DESCRIPTION OF THE INVENTION

While this invention has been particularly shown and described with references to example embodiments thereof, it will be understood by those skilled in the art that various changes in form and details may be made therein without departing from the scope of the invention encompassed by the appended claims.

While various compositions and methods are described, it is to be understood that this invention is not limited to the particular molecules, compositions, designs, methodologies or protocols described, as these may vary. It is also to be understood that the terminology used in the description is for the purpose of describing the particular versions or versions only, and is not intended to limit the scope of the present invention which will be limited only by the appended claims.

It must also be noted that as used herein and in the appended claims, the singular forms "a", "an", and "the" include plural reference unless the context clearly dictates otherwise. Thus, for example, reference to a "surface dielectric layer" is a reference to one or more surface dielectric layers and equivalents thereof known to those skilled in the art, and so forth. Unless defined otherwise, all technical and scientific terms used herein have the same meanings as commonly understood by one of ordinary skill in the art. Methods and materials similar or equivalent to those described herein can be used in the practice or testing of versions of the present invention. All publications mentioned herein are incorporated by reference in their entirety. Nothing herein is to be construed as an admission that the invention is not entitled to antedate such disclosure by virtue of prior invention. "Optional" or "optionally" means that the subsequently described event or circumstance may or may not occur, and that the description includes instances where the event occurs and instances where it does not. All numeric values herein can be modified by the term "about," whether or not explicitly indicated. The term "about" generally refers to a range of numbers that one of skill in the art would consider equivalent to the recited value (i.e., having the same function or result). In some versions the term "about" refers to ±10% of the stated value, in other versions the term "about" refers to ±2% of the stated value. While compositions and methods are described in terms of "comprising" various components or steps (interpreted as meaning "including, but not limited to"), the compositions and methods can also "consist essentially of" or "consist of" the various components and steps, such terminology should be interpreted as defining essentially closed-member groups.

Figure 1A:
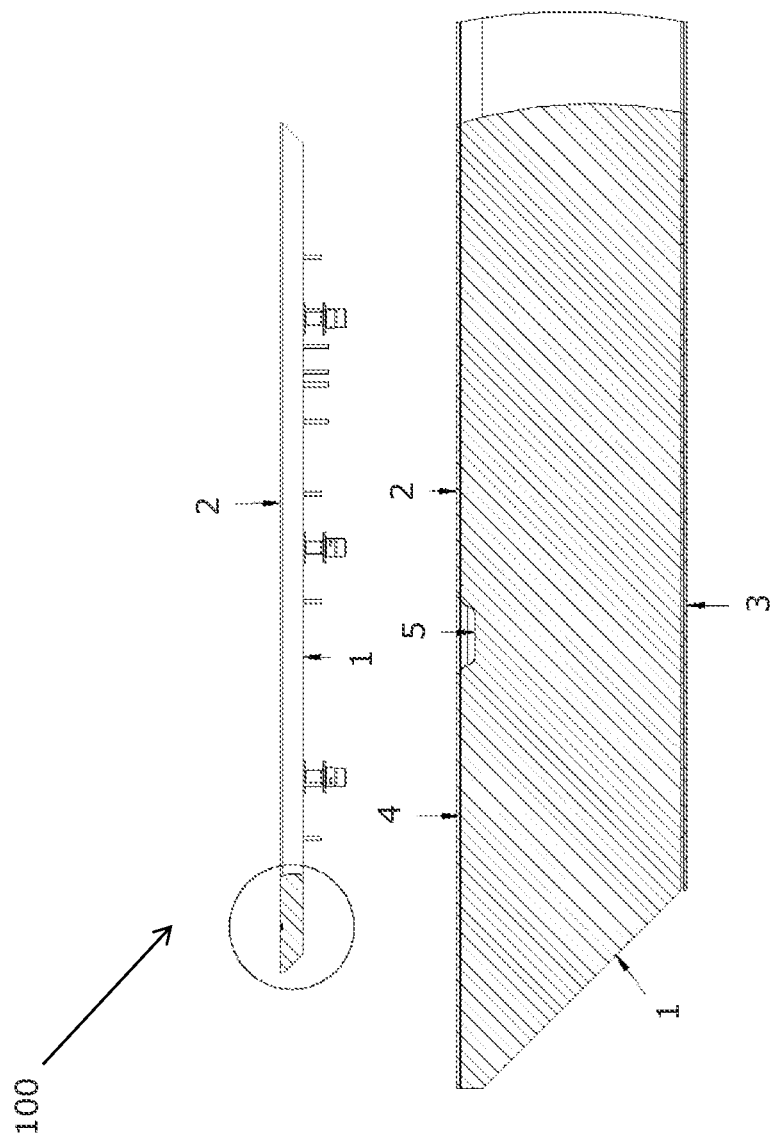
FIG. 1A is a side view of an electrostatic chuck in accordance with one version of the invention.
Figure 1B:
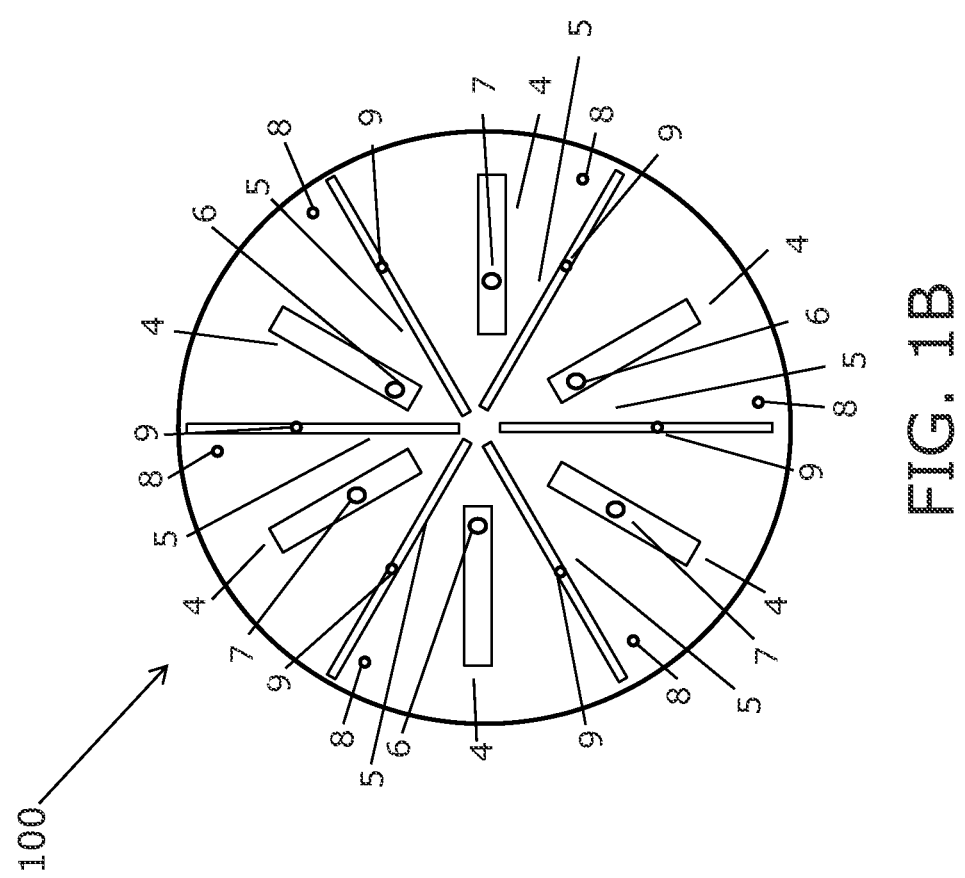
FIG. 1B is a top view of an electrostatic chuck in accordance with one version of the invention.

In one version, shown in FIGS. 1A and 1B, an electrostatic chuck 100 includes a ceramic structural element 1, at least one electrode 4 (shown in FIG. 1B as six electrodes 4) disposed on the ceramic structural element 1, and a surface dielectric layer 2, shown in FIG. 1A, deposited over the at least one electrode 4, the surface dielectric layer 2 activated by a voltage in the electrode 4 to form an electric charge to electrostatically clamp a substrate (not shown) to the electrostatic chuck 100. The electrostatic chuck 100 further includes a heater trace 3 and a gas channel 5.

Turning to FIG. 1A, the ceramic structural element 1 can be made of a variety of ceramic materials, such as alumina ($Al_2O_3$), sapphire, aluminum nitride, silicon nitride, or the like. In one version, the ceramic structural element is made of alumina ($Al_2O_3$), in a range of between about 96% and about 99.8% pure alumina, such as greater than 97% alumina, or greater than 99.5% alumina, and annealed at temperatures greater than about 1000° C. to remove defects and stress points, and polished at the front and rear sides. The ceramic structural element 1 can be a disc, with a diameter of about 300 mm, and a thickness in a range of between about 2 mm and about 15 mm, such as a range of between about 4 mm and about 12 mm, or a range of between about 6 mm and about 10 mm, such as a thickness of about 10 mm. The side face of the ceramic structural element 1 can be chamfered at an angle in a range of between about 30 degrees and about 60 degrees, such as between about 40 degrees and about 50 degrees, or between about 43 degrees and about 47 degrees, such as at an angle of about 45 degrees, as shown in FIG. 1A.

Turning to FIG. 1B, the electrostatic chuck 100 further includes lift pin holes 6; ground pin holes 7; electrode pins 8; and gas holes 9. The at least one electrode 4, can be a plurality of electrodes, such as 1 electrode, 2 electrodes, 3 electrodes, 4 electrodes, 5 electrodes, 6 electrodes (as shown in FIG. 1B), 7 electrodes, 8 electrodes, 9 electrodes, or 10 electrodes. The electrodes 4 can be made of a variety of metals, such as aluminum, titanium, molybdenum, silver, platinum, gold, nickel, tungsten, chromium, vanadium, ruthenium, iron, palladium, Kovar® or other nickel-cobalt ferrous alloy, or manganese; or a nitride, such as titanium nitride. In one version, the electrodes 4 are made of nickel. The thickness of the electrodes 4 can be in a range of between about 5 μm and about 10 nm, such as a range of between about 2 μm and about 50 nm, or a range of between about 1 μm and about 200 nm. In one version, the thickness of the electrodes 4 is about 1 μm; in other versions, the thickness of the electrodes 4 is less than about 0.5 microns, or less than about 0.25 microns. The electrodes 4 can be disposed on the insulator 1 by a variety of techniques, such as screen printing, direct writing, plasma deposition followed by etch, plasma deposition followed by mechanical patterning, electro-deposition followed by patterning, laser deposition, electroplating, and atomic layer deposition followed by patterning.

Turning back to FIG. 1A, the surface dielectric layer 2 that is deposited over the electrode 4 can be made of a variety of materials, and combinations of layers of materials. The choice of materials is determined by the following requirements for the material: 1) a high dielectric constant (i.e., a dielectric constant in a range of between about 4 and about 50), 2) a thermal expansion coefficient suitable to match to the electrode 4 and the ceramic structural element 1, 3) low particle generation, 4) good electrical encapsulation of the electrode 4 for a high voltage breakdown strength sufficient to hold off the applied voltage, 5) no metals contamination, such as contamination typically encountered in glass coatings (this requirement is particularly important at high temperatures where elements in the coatings are relatively mobile), 6) a surface dielectric layer 2 that is conformal over the electrodes 4, dense, and relatively free of pinholes or other defects (which may be achieved, for example, using ALD-deposited amorphous alumina), 7) a plasma etch resistant surface, and 8) an abrasion resistant surface. Within these requirements, the surface dielectric layer 2 can be made of, for example, one or more of alumina, yttria, zirconia, aluminum oxynitride (AlON), aluminum nitride, silicon oxide, silicon oxynitride, silicon nitride, a transition metal oxide, a transition metal oxynitride, a rare earth oxide, or a rare earth oxynitride. The surface dielectric layer 2 can be a polycrystalline thin film, an amorphous thin film, or a quasi-crystalline thin film. The surface dielectric layer 2 can be a single layer, or a stack of dielectric layers, such as a stack of 2 layers, 3 layers, 4 layers, 5 layers, 6 layers, 7 layers, or 8 layers. The thickness of the surface dielectric layer 2 can be in a range of between about 1 μm and about 250 μm, such as a thickness between about 10 μm and about 70 μm, or a thickness between about 25 μm and about 50 μm. The thickness of the surface dielectric layer 2 is determined in part by the effective dielectric constant of the surface dielectric layer, such that a surface dielectric layer with a lower dielectric constant will need to be thicker in order to provide sufficient dielectric breakdown strength, but the thermal expansion (in a temperature range of between, for example, about −150° C. and about 750° C.) of a thicker surface dielectric layer will be more challenging to match to the electrode 4 and the ceramic structural element 1. To provide sufficient chucking force, the surface dielectric layer needs to hold an electrical peak DC potential difference of more than about 500V, such as about 1000 V, that is applied between the top and bottom of the surface dielectric layer 2.

The surface dielectric layer 2 can be deposited over the electrode 4 by a variety of thin film deposition techniques, such as atomic layer deposition (ALD), chemical vapor deposition (CVD), plasma enhanced chemical vapor deposition, physical vapor deposition (PVD), electron beam deposition, spray coating, atmospheric plasma deposition, high pressure plasma deposition, electrochemical deposition, and sputter deposition. The specific thin film deposition technique can be determined by the choice of material, in that some thin film deposition techniques are especially suitable for depositing certain materials, such as, for example, silicon oxide is typically deposited by CVD, AlON is typically deposited by PVD, alumina can be deposited by ALD, and yttria can be deposited by PVD.

The surface dielectric layer 2 can be a single electrically insulating layer deposited by any of the thin film deposition techniques discussed above. In one version, the surface dielectric layer 2 is an insulator layer of alumina deposited by atomic layer deposition over the electrodes 4. Atomic layer deposition of alumina, as described in more detail below, typically involves heating the substrate to be coated to a temperature in a range of between about 200° C. and about 300° C. in a heated reactor, and alternately introducing first water ($H_2O$) and then tri-methyl aluminum (TMA) into the reactor, which react to produce a single atomic layer of alumina ($Al_2O_3$). The cycle is repeated until the desired thickness of the alumina layer is grown, which can be many thousands of cycles, such as, for example, 10,000 cycles to grow a layer of alumina of a thickness of about 1 μm (given that an atomic layer is approximately 1 Angstrom thick). It takes many hours (e.g., about 33 hours) to grow a 1 μm layer of alumina by ALD. As shown in FIG. 2A, it is possible to have a single layer of ALD grown alumina 210 form the entirety of the surface dielectric layer 2 over the electrode 4 and ceramic structural element 1 of the electrostatic chuck 200, if the layer of ALD grown alumina is sufficiently thick to withstand the potential difference across the surface dielectric layer 2 during operation of the electrostatic chuck 200, but the required thickness might be on the order of several microns, which, under some manufacturing circumstances, may not be readily practical given the length of time required for ALD. For a thicker dielectric layer, therefore, it is generally desirable, as shown in FIG. 2B, to have the layer of ALD grown alumina form an insulator layer 220 over the electrode 4 and the ceramic structural element 1, and further include a stack of dielectric layers deposited over the insulator layer 220. Among other things, the stack of dielectric layers can be of a type that can be formed to the desired thickness in a shorter length of time than would be an equivalent thickness consisting only of ALD grown alumina. As shown in FIG. 2B, the stack of dielectric layers can include a first dielectric layer 230 deposited over the insulator layer 220, the first dielectric layer 230 including silicon oxide ($SiO_x$, $x \approx 2$), a second dielectric layer 240 deposited over the first dielectric layer, the second dielectric layer 240 including aluminum oxynitride (AlON), and a third dielectric layer 250 deposited over the second dielectric layer, the third dielectric layer including silicon oxide ($SiO_x$, $x \approx 2$). In these specific versions, the thickness of the first dielectric layer 230 can be in a range of between about 10 μm and about 50 μm, such as about 20 μm, the thickness of the second dielectric layer 240 can be in a range of between about 1 μm and about 20 μm, such as about 10 μm, and the thickness of the third dielectric layer 250 can be in a range of between about 10 μm and about 50 μm, such as about 20 μm. The third dielectric layer can also include silicon nitride or aluminum oxide. Additionally, another layer of, for example, alumina can be deposited over the stack of dielectric layers, which may serve as a diffusion barrier layer. Alternatively, the stack of dielectric layers can be deposited over the electrode 4 without an insulator layer between the electrode 4 and the stack of dielectric layers, optionally followed by another layer of, for example, ALD grown alumina deposited over the stack of dielectric layers, which may serve as a diffusion barrier layer.

Figure 3:
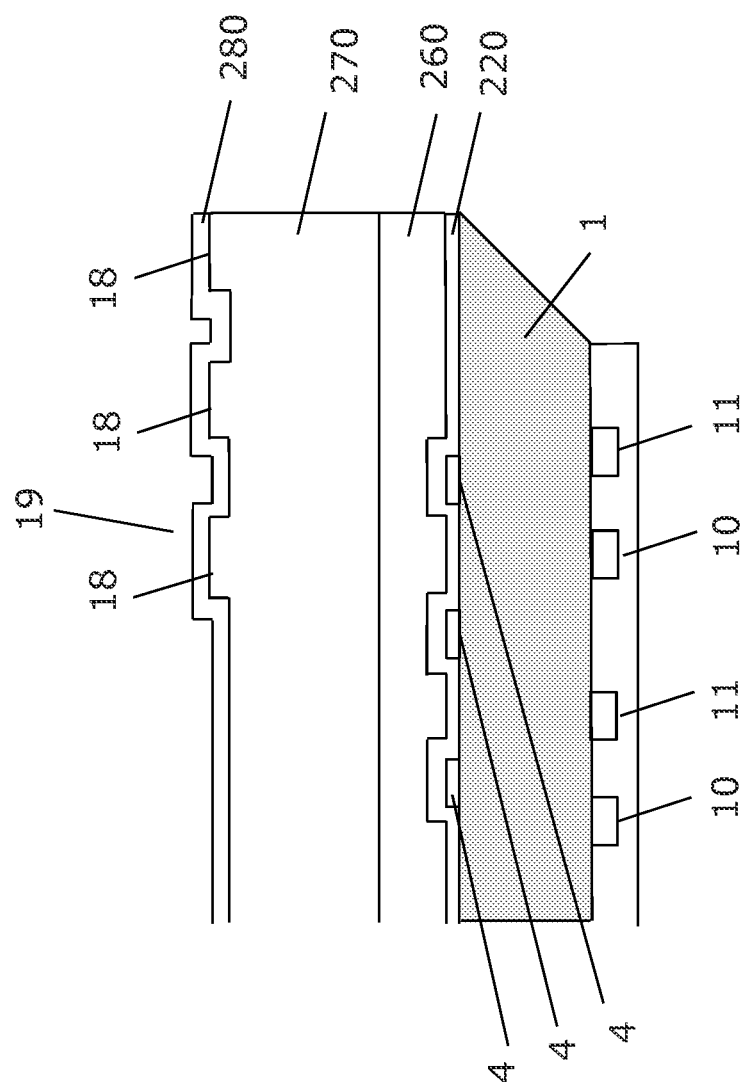
FIG. 3 is a schematic illustration of an electrostatic chuck having a surface dielectric layer that includes an insulator layer over the at least one electrode and a stack of two dielectric layers over the insulator layer in accordance with one version of the invention.

FIG. 3 is a schematic illustration of an electrostatic chuck having a surface dielectric layer that includes an insulator layer over the at least one electrode and a stack of two dielectric layers over the insulator layer in accordance with one version of the invention. The electrostatic chuck includes a ceramic structural element 1, and one or more outer heater traces 10 and inner heater traces 11. The heater traces 10 and 11 can be screen-printed, and coated with an insulator, such as a thin-film glass coating. The electrodes 4 should be made of a material that has a low diffusivity through the dielectric at high temperature. In particular, the electrodes 4 can be made of a variety of metals, such as aluminum, titanium, molybdenum, silver, platinum, gold, nickel, tungsten, chromium, vanadium, ruthenium, iron, palladium, Kovar® or other nickel-cobalt ferrous alloy, or manganese; or a nitride, such as titanium nitride. The thickness of the electrodes 4 can be less than about 0.5 μm, such as less than about 0.25 μm. In one version, electrodes 4 can be formed, for example, of a conductor such as nickel, in a thickness of about 0.5 μm. The electrodes 4 are coated with an ALD-deposited overlaying insulator layer 220 of amorphous alumina ($Al_2O_3$). The insulator layer 220 can be of a thickness up to about 5 μm, such as between about 0.5 μm and about 2 μm, such as about 1 μm. Above the insulator layer 220 is a stack of dielectric layers that includes a first dielectric layer 260 and a second dielectric layer 270. In this version, the first dielectric layer 260 is formed of aluminum oxynitride (AlON), which can be of a thickness of, for example, about 10 μm; and the second dielectric layer 270 is formed of silicon oxide or silicon oxynitride, which can be of a thickness of, for example, between about 40 μm and about 50 μm. The first dielectric layer 260 can be formed by physical vapor deposition (PVD) of aluminum oxynitride (AlON); and the second dielectric layer 270 can be formed by chemical vapor deposition (CVD) of silicon oxide or silicon oxynitride. In some versions, the insulator layer 220 of amorphous alumina comprises alumina of formula $Al_xO_y$, where x is in the range of 1.8 to 2.2 and y is in the range of 2.6 to 3.4, which may be deposited by atomic layer deposition; the first dielectric layer 260 comprises aluminum oxynitride of formula $AlO_xN_y$, where x is in the range of 1.4 to 1.8 and y is in the range of 0.2 to 0.5, and may be deposited by physical vapor deposition; the second dielectric layer 270 comprises silicon oxide of formula $SiO_x$, where x is in the range of 1.8 to 2.4, which may be deposited by chemical vapor deposition; and/or the second dielectric layer 270 comprises silicon oxynitride of formula $SiO_xN_y$, where x is in the range of 1.6 to 2.0 and y is in the range of 0.1 to 0.5, which may be deposited by chemical vapor deposition. Table 1 shows composition of the foregoing materials in an experimental electrostatic chuck in accordance with a version of the invention, as measured by energy-dispersive X-ray spectroscopy (EDS) using 5 keV electron beam energy:

TABLE 1

Example of Composition of Layers of Electrostatic Chuck

| Atomic % | N | O | Al | Si |
|---|---|---|---|---|
| ALD Al2O3 |  | 58 | 41 |  |
| CVD SiO*x* |  | 68.67 |  | 31.33 |
| CVD SiO*x*N*y* | 6.24 | 60.38 |  | 33.38 |
| PVD AlON | 9.66 | 61.66 | 28.69 |  |
|  | Al | O | N |  |

In the version of FIG. 3, the first dielectric layer 260, formed of aluminum oxynitride (AlON) can provide the advantage of functioning to match the coefficient of thermal expansion (CTE) from the amorphous alumina layer 220 to the oxide layer (second dielectric layer 270) above it. Further, the AlON of the first dielectric layer 260 can provide a high dielectric constant, which assists in providing greater clamp force. The second dielectric layer 270, which is formed of silicon oxide or silicon oxynitride, can provide the advantage of performing as a good insulator, with robust thermal properties, and of providing space between the electrodes 4 and the clamped substrate. The second dielectric layer 270 can include protrusions (or embossments) 18, which extend to a height above surrounding areas of the second dielectric layer 270, and which can be formed by etching of the second dielectric layer 270. The height of the protrusions 18 can be in the range of from about 3 µm to about 15 µm, such as between about 6 µm and about 8 µm. Over the protrusions 18, the electrostatic chuck can include a diffusion barrier layer 280, which can be formed of ALD-deposited amorphous alumina ($Al_2O_3$). In addition to serving as a diffusion barrier, layer 280 can assist in providing a better high temperature contact for the substrate (as compared, for example, with oxide layer 270, which could potentially weld to the substrate at high temperatures). The diffusion barrier layer 280 can have a thickness of between about 0.2 µm and about 1 µm. Although various layers are described herein as being primarily an insulator layer or a diffusion barrier layer, it should be understood that layers so identified may serve one or both functions of being an insulator and a diffusion barrier. For example, insulator layer 220 can serve as both an insulator layer and a diffusion barrier. The purpose of a diffusion barrier is, among other things, to prevent metal contaminants from reaching a substrate, such as a semiconductor wafer, that is being clamped by the electrostatic chuck. In some cases, diffusion barrier layers may be as thin as, for example, about 0.2 µm or less, or less than about 10 nm thick.

Although the version of FIG. 3 shows the protrusions 18 as being included in the second dielectric layer 270, there a variety of different possible arrangements for the protrusions 18. In accordance with versions of the invention, a substrate contacting surface 19 of the electrostatic chuck can include protrusions extending to a height above portions of the substrate contacting surface of the electrostatic chuck that surround the protrusions. The protrusions can be formed by a variety of different possible methods, including etching and deposition. For example, protrusions 18 may be formed in an underlying layer, after which a coating 280, such as a diffusion barrier of alumina deposited by atomic layer deposition, may be formed over the underlying protrusions 18. In another example, protrusions can be formed by forming an underlying planar layer, such as a planar layer of alumina deposited by atomic layer deposition, and then depositing protrusions on top of the planar layer. For example, silicon oxide protrusions, of a height such as 8 to 10 microns, can be deposited on top of a planar diffusion barrier of alumina deposited by atomic layer deposition. The substrate contacting surface 19 of the electrostatic chuck can comprise a variety of different possible materials, such as at least one of: alumina deposited by atomic layer deposition, silicon oxide, silicon nitride, silicon oxynitride and silicon-rich oxide.

In accordance with versions of the invention, physical features on the ceramic structural element 1 are treated to produce rounded edges, prior to applying the ALD-deposited amorphous alumina of insulator layer 220. This can include, for example, the gas holes, gas channels, lift pin holes and ground pin holes. Such features can be lapped to produce rounded edges, prior to application of the ALD-deposited insulator layer 220.

In accordance with versions of the invention, the layers of ALD-deposited amorphous alumina, such as insulator layer 220 and diffusion barrier layer 280, can be low-defect or defect-free alumina layers, with few or no pinhole defects, and have very high density. The porosity of the ALD-deposited amorphous alumina layers can be low, such as less than about 2 volume percent, less than about 1 volume percent, or less than about 0.5 volume percent, measured as the volume of void-space as a percent of the total volume of alumina (including both the void-space and the solid alumina). In addition, the ALD-deposited amorphous alumina of the insulator layer 220 can provide a high dielectric strength, such as a minimum dielectric strength of at least about 200 V per micron; for example between about 200 V per micron and about 400 V per micron; or of at least about 500 V per micron; or of at least about 800 V per micron. This dielectric strength means that the ALD-deposited alumina is substantially pinhole defect-free, since pinhole defects cause lower dielectric strength and result in arcing. The above dielectric strengths may be as measured using a larger test electrode than a more typical test method, which uses a ball of approximately one quarter inch diameter as the test electrode on the surface of the insulator layer 220, with the electrodes 4 being connected to ground. Instead, the dielectric strength may be measured using a larger test electrode, over an average area of the surface of the insulator layer 220, such as a full surface of the insulator layer 220. Dielectric strengths given herein are measured at room temperature, although they may be approximately the same values at higher temperatures. Table 2 is a table of material properties of the layers 220, 260 and 270 of the electrostatic chuck of FIG. 3, where "ALD $Al_2O_3$" corresponds to insulator layer 220, "PVD AlON" corresponds to first dielectric layer 260, and "PECVD $SiO_x$" and "PECVD $SiO_xN_y$" correspond to possible choices for second dielectric layer 270:

TABLE 2

Example of Material Properties of Layers of Electrostatic Chuck

| | Dielectric Breakdown Strength (V/∃m) | | Elastic Modulus (GPa) | | Hardness (GPa) | |
|---|---|---|---|---|---|---|
| | as-deposited | annealed | as-deposited | annealed | as-deposited | annealed |
| ALD $Al2O3$ | 563 | 289 | 225 | 265 | 10 | 11 |
| PVD AlON | 67 | 59 | 200 | 145 | 9 | 7.5 |
| PECVD SiOx | 91 | 82 | 90 | 75 | 7 | 7 |
| PECVD SiOxNy | 104 | 79 | 95 | 85 | 6.5 | 6.5 |

It can be seen in Table 1 that the dielectric breakdown strength of insulator 220 ("ALD $Al_2O_3$"), as annealed, is measure as 289 V per micron, and generally can be in the ranges given above; the dielectric breakdown strength of first dielectric layer 260 ("PVD AlON"), as annealed, is measured as 59 V per micron, and generally can be at least about 50 V per micron; the dielectric breakdown strength of second dielectric layer 270, for silicon oxide ("PECVD $SiO_x$"), as annealed, is measure as 82 V per micron, and generally can be greater than about 70 V per micron; and the dielectric breakdown strength of second dielectric layer 270, for silicon oxynitride ("PECVD $SiO_xN_y$"), as annealed is measured as 79 V per micron, and generally can be greater than about 70 V per micron.

Turning back to FIGS. 1A and 1B, the electrostatic chuck 100 can also include a system of gas channels 5 that are constructed at or near the front side of the ceramic structural element 1 with one or more through holes 9 to the backside to allow for gas (e.g., nitrogen, argon, or other gas) to be delivered to the gas channels 5 for providing thermal energy exchange with the electrostatically clamped workpiece or substrate (not shown) by conduction and/or convection. The gas channels 5 are arranged in a pattern that can be a radial pattern, as shown in FIG. 1B, or a star pattern, an axial pattern, a honeycomb pattern, a spiral pattern, or a straight line pattern. The cross section shape of the gas channels 5 can be one or more of a rectangular shape with rounded corners, a square shape, a half circular shape, an oval shape, and an elongated triangular shape. The cross section area of the gas channels 5 can be between about 0.1 mm$^2$ and 5 mm$^2$. The surface of the channels can be coated with an electrically insulating coating, or, alternatively, an electrically conducting coating. As shown in FIG. 1B, the gas channels 5 are provided with one or more gas feed holes 9 that connect to the backside of the ceramic structural element 1. The gas holes 9 are integrated into mounting posts 14 (see FIG. 1C) that can be brazed or threaded into the ceramic structural element 1. The mounting posts 14 have the function to (1) secure the ceramic structural element 1 to the base of the electrostatic chuck assembly, (2) minimize heat conduction between the ceramic structural element 1 and the base of the electrostatic chuck assembly, and (3) allow for gas delivery from the base of the electrostatic chuck assembly to the gas channels at the front of the ceramic structural element.

Turning back to FIG. 1B, the ceramic structural element 1 also includes through holes 6 at various locations to allow for clearance of lift pins, and one or more embedded temperature sensors (not shown) mounted in holes provided from the rear side and reaching near the surface of the front side of the ceramic structural element, the temperature sensors being held in place by one or more the following techniques: cementing, glass bonding, threaded securing, press fitting, brazing, and gluing. The embedded temperature sensors can be one or more of the following: a resistance temperature detector (RTD), a thermocouple, a thermistor, and a silicon band gap temperature sensor. The ceramic structural element 1 can also include a gas seal ring (not shown), providing a continuous gas seal on the front side of the ceramic structural element around the perimeter of the electrostatic chuck and around the lift pin holes.

Turning to FIG. 1C, the electrostatic chuck 100 further includes a resistive heater comprised of outer heater zone 10 and inner heater zone 11; an outer temperature sensor 12; an inner temperature sensor 13; a mounting post 14; and a heater pin 15. The heater zones 10 and 11 are deposited and encapsulated on the rear side of the ceramic structural element 1. The temperature of the outer and inner heater zones is measured by outer and inner embedded temperature sensors 12 and 13, respectively. The embedded temperature sensors 12 and 13 are mounted in holes provided from the rear side of the ceramic structural element 1 and reaching near the surface of the front side of the ceramic structural element 1, the embedded temperature sensors 12 and 13 being held in place by one or more of the following techniques: cementing, glass bonding, threaded securing, press fitting, brazing, and gluing. The temperature of the outer 10 and inner 11 heater zones can also be monitored by measuring the temperature-dependent resistance of the outer 10 and inner 11 heater traces, respectively.

Method of Manufacturing the Deposited Dielectric Electrostatic Chuck (DDESC)

The DDESC is constructed around a ceramic structural element which is typically an alumina disc, approximately 300 mm in diameter, about 10 mm thick with a chamfered side face, typically chamfered at around 45 degrees. The alumina is typically made from 96% or 99.8% pure $Al_2O_3$ material and has several features machined into it which will serve as (1) through holes for electrical contacts, (2) through holes to clear lift pins, blind holes for mounting electrical contact posts, through holes to deliver gas from the backside to the front side, and a groove pattern at the front side that will serve as gas channels.

The ceramic structural element is cleaned and annealed in air to approximately 900° C. for at least one hour, using a ramp rate of no more than about 100° C./hr (for heating and cooling).

The heater is mounted to the rear side of the ceramic structural element. This is typically done by using a direct-writing method that deposits a conductive metallic heater trace, the metal being either silver or platinum, or the like. The heater trace is encapsulated with a thin film glass coating to allow for (1) electrical shielding and (2) mechanical shielding. Alternatively, the heater can be encapsulated later with an insulator layer by means of a thin film deposition technique, such as ALD, PVD, or CVD. The heater is typically comprised of two or more separate heater loops, also called heater zones, which are powered independently.

The electrical connections are mounted onto the ceramic structural element. There are two connectors for each heater zone (typically two or more heater zones), plus one connector for each electrode (typically six electrodes), plus one connector for each mounting post (typically six mounting posts). The connections are typically all made of Kovar® pins and all are brazed at the same time at around 900° C. in a controlled atmosphere. Other methods to secure the connections are possible, such as cementing, using threaded connections, glass bonding, press-fitting, or diffusion bonding.

In addition to providing a strong mechanical connection, the mounting of the connections has the following requirements, in versions of the invention: (1) The heater electrical connections need to have low resistivity to the heater trace; (2) The mounting posts need to have a leak-tight, hermetic seal, as the mounting posts serve as the gas supply feed-through, in addition to providing the mechanical mount.

The front side of the ceramic structural element is lapped to provide a smooth and flat front side surface. At this stage, the front side shows only the heads of six small Kovar® pins that are level with the surrounding alumina structural element. Furthermore, the front side shows three lift pin holes (through holes) and the grooves for the gas channels. The top corners of the gas channels should be rounded to provide the proper radius of the gas channel profile.

The rear side of the ceramic structural element has the encapsulated heater, now electrically connected to the Kovar® connector that is sticking out. In addition, there are six Kovar® pins sticking out for the electrode connections and six Kovar® mounting posts. The rear side of the ceramic structural element also has several open blind holes that are utilized to mount embedded temperature sensors.

This ceramic assembly is cleaned in wet chemical baths and the front side is coated with a metal film (typically nickel, platinum, nickel-chrome, molybdenum, or silver), approximately 1 micron in thickness, which is patterned into several equal-sized electrode shapes (typically six), by means of photo-masking and etching. The orientation and shape of the electrodes is such that each of the electrodes contacts one of the electrode connector pins, but each electrode is electrically isolated from one another, thus providing six separate metal electrodes that have electrical connections to the rear side of the ceramic structural element.

This ceramic assembly is cleaned in wet chemical baths and annealed at a temperature of about 300° C. to anneal the metal and allow for outgassing of any volatile compounds.

This ceramic assembly with rear side heater, electrical connectors and exposed metal electrodes at the front side receives a 1 micron alumina atomic layer deposition (ALD) coating. The ALD deposition method produces a coating that is highly conformal, very dense and nearly pin-hole free and encapsulates the entire assembly (front side, rear side, holes, side faces, etc.). The ALD coating is typically performed at temperatures between 200° C. and 300° C. in a heated reactor (e.g., having the reactor walls at a temperature of about 250° C. and the ceramic assembly at a temperature of about 250° C.) and typically requires about 10,000 gas deposition cycles alternating between pulsing water ($H_2O$) for 0.015 seconds, waiting 5-10 seconds, and pulsing TMA (tri-methyl aluminum) for 0.015 seconds, waiting 5-10 seconds, and repeating the cycle to produce a 1 micron thick film of alumina.

The ALD-coated assembly receives additional coatings of dielectric material at the front side. This is to produce a dielectric barrier with greater dielectric breakdown strength. The dielectric coating can be comprised of one or more layers, each layer carefully selected from materials with high dielectric strength and well matched thermal expansion and interface adhesion coefficients. As an example, the dielectric coating stack can be comprised of 20 microns of silicon-oxide, 10 microns of aluminum oxy-nitride and 20 microns of silicon-oxide. Alternatively, the dielectric coating stack can be comprised of 10 microns of aluminum oxynitride (AlON), and 40 to 50 microns of silicon oxide or silicon oxynitride. The coatings can be applied by thin film deposition methods such as chemical vapor deposition (CVD), plasma enhanced chemical vapor deposition (PECVD), physical vapor deposition (PVD), electron beam deposition, spray coatings, or atmospheric plasma deposition.

The embossment and gas seal ring structure is formed on top of the dielectric stack as described elsewhere. See PCT Application No. PCT/US2010/034667 published as WO 2010/132640 A2 on Nov. 18, 2010, PCT Application No. PCTUS2011/037712 published as WO 2011/149918 A2 on Dec. 1, 2011, and PCT Application No. PCT/US2011/050841 published as WO 2012/033922 A2 on Mar. 15, 2012. The embossments can be made of a variety of materials, including materials such as silicon oxide ($SiO_x$, x≈2), silicon nitride, or aluminum oxide; and can be etched out of the material of the top layer of the dielectric stack, or made by other techniques discussed herein. A diffusion barrier layer of ALD-coated alumina of 1 micron thickness can be deposited over the dielectric coating stack.

Temperature sensors are cemented into the blind holes at the rear side of the assembly. The temperature sensors can be, for example, resistance temperature detectors (RTDs) or thermocouples (TCs).

The electrostatic chuck assembly is mounted on a base structure, which holds heat shields, mounting provisions, electrical wiring and gas supply, thus completing the DDESC.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant to mean an example, rather than the best. It is also to be appreciated that features and/or elements depicted herein are illustrated with particular dimensions and/or orientations relative to one another for purposes of simplicity and ease of understanding, and that the actual dimensions and/or orientations may differ substantially from that illustrated herein.

Although the present invention has been described in considerable detail with reference to certain versions thereof, other versions are possible. Therefore the spirit and scope of the appended claims should not be limited to the description and the versions contain within this specification.

The teachings of all patents, published applications and references cited herein are incorporated by reference in their entirety.

What is claimed is:

1. An electrostatic chuck comprising:
   a ceramic structural element;
   at least one electrode disposed on the ceramic structural element; and
   a surface dielectric layer disposed over the at least one electrode, the surface dielectric layer activated by a voltage in the electrode to form an electric charge to electrostatically clamp a substrate to the electrostatic chuck, the surface dielectric layer comprising:
   (i) an insulator layer of amorphous alumina, of a thickness of less than 5 microns, disposed over the at least one electrode; and
   (ii) a stack of dielectric layers disposed over the insulator layer, the stack of dielectric layers including:
      (a) at least one dielectric layer including aluminum oxynitride; and
      (b) at least one dielectric layer including at least one of silicon oxide and silicon oxynitride.

2. The electrostatic chuck of claim 1, wherein the surface dielectric layer has a thickness in a range of between 22 µm and 122 µm.

3. The electrostatic chuck of claim 1, wherein the surface dielectric layer includes a silicon nitride layer.

4. The electrostatic chuck of claim 1, wherein the surface dielectric layer includes a silicon oxynitride layer.

5. The electrostatic chuck claim 1, wherein at least one of the insulator layer and the dielectric layers is an electrically insulating layer.

6. The electrostatic chuck of claim 5, wherein the electrically insulating layer is deposited with the thin film deposition technique of atomic layer deposition.

7. The electrostatic chuck of claim 5, wherein the electrically insulating layer is deposited with a thin film deposition technique selected from the group consisting of chemical vapor deposition, plasma enhanced chemical vapor deposition, physical vapor deposition, electron beam deposition, spray coating, atmospheric plasma deposition, high pressure plasma deposition, electrochemical deposition, and sputter deposition.

8. The electrostatic chuck of claim 5, wherein the surface dielectric layer is conformal.

9. The electrostatic chuck of claim 5, wherein the surface dielectric layer has a thickness between 22 micron and 122 microns.

10. The electrostatic chuck of claim 9, wherein the surface dielectric layer has a thickness between 22 microns and 70 microns.

11. The electrostatic chuck of claim 10, wherein the surface dielectric layer has a thickness between 25 microns and 50 microns.

12. The electrostatic chuck of claim 1, wherein the surface dielectric layer has the ability to hold an electrical peak voltage of more than 500V that is applied between the top and bottom of the surface dielectric layer.

13. The electrostatic chuck of claim 12, wherein the surface dielectric layer has the ability to hold an electrical peak voltage of more than 1000V that is applied between the top and bottom of the surface dielectric layer.

14. The electrostatic chuck of claim 1, wherein the surface dielectric layer is stable at temperatures between −150° C. and +750° C.

15. The electrostatic chuck of claim 1, wherein the surface dielectric layer fulfills the function of at least one of: (1) high strength dielectric barrier, (2) dielectric layer with inherently low metals contamination and low particle source, (3) a plasma etch resistant surface, (4) an abrasion resistant surface.

16. The electrostatic chuck of claim 1, wherein the insulator layer of amorphous alumina is deposited by atomic layer deposition over the at least one electrode.

17. The electrostatic chuck of claim 16, wherein the insulator layer has a thickness in a range of between 0.5 μm and 2 μm.

18. The electrostatic chuck of claim 17, wherein the thickness of the insulator layer is 1 μm.

19. The electrostatic chuck of claim 1, wherein the stack of dielectric layers includes:
   i) a first dielectric layer deposited over the insulator layer, the first dielectric layer including silicon oxide;
   ii) the at least one dielectric layer including aluminum oxynitride, deposited as a second dielectric layer over the first dielectric layer; and
   iii) the at least one dielectric layer including at least one of silicon oxide and silicon oxynitride, deposited as a third dielectric layer over the second dielectric layer, the third dielectric layer including silicon oxide.

20. The electrostatic chuck of claim 19, wherein the first dielectric layer has a thickness in a range of between 10 μm and 50 μm.

21. The electrostatic chuck of claim 20, wherein the thickness of the first dielectric layer is 20 μm.

22. The electrostatic chuck of claim 19, wherein the second dielectric layer has a thickness in a range of between 1 μm and 20 μm.

23. The electrostatic chuck of claim 22, wherein the thickness of the second dielectric layer is 10 μm.

24. The electrostatic chuck of claim 19, wherein the third dielectric layer has a thickness in a range of between 10 μm and 50 μm.

25. The electrostatic chuck of claim 24, wherein the thickness of the third dielectric layer is 20 μm.

26. The electrostatic chuck of claim 1, wherein the ceramic structural element includes alumina.

27. The electrostatic chuck of claim 1, wherein the ceramic structural element includes aluminum nitride.

28. The electrostatic chuck of claim 1, wherein the ceramic structural element includes silicon nitride.

29. The electrostatic chuck of claim 1, wherein the at least one electrode includes at least one of: aluminum, titanium, molybdenum, silver, platinum, gold, nickel, tungsten, chromium, vanadium, ruthenium, iron, palladium, nickel-cobalt ferrous alloy, manganese, and a nitride.

30. The electrostatic chuck of claim 29, wherein the at least one electrode includes titanium nitride.

31. The electrostatic chuck of claim 1, wherein the at least one electrode comprises a thickness of less than 0.5 microns.

32. The electrostatic chuck of claim 1, wherein the at least one electrode comprises a thickness of less than 0.25 microns.

33. The electrostatic chuck of claim 1, wherein the stack of dielectric layers includes:
   i) the at least one dielectric layer including aluminum oxynitride, being a first dielectric layer disposed over the insulator layer; and
   ii) the at least one dielectric layer including at least one of silicon oxide and silicon oxynitride, being a second dielectric layer disposed over the first dielectric layer.

34. The electrostatic chuck of claim 33, wherein the thickness of the first dielectric layer is 10 μm.

35. The electrostatic chuck of claim 33, wherein the second dielectric layer has a thickness in a range of between 40 μm and 50 μm.

36. The electrostatic chuck of claim 1, wherein a substrate contacting surface of the electrostatic chuck comprises a plurality of protrusions extending to a height above portions of the substrate contacting surface of the electrostatic chuck surrounding the plurality of protrusions.

37. The electrostatic chuck of claim 36, wherein the plurality of protrusions comprise a height of between 3 microns and 15 microns.

38. The electrostatic chuck of claim 37, wherein the plurality of protrusions comprise a height of between 6 microns and 8 microns.

39. The electrostatic chuck of claim 36, wherein the plurality of protrusions comprise at least one of etched protrusions and deposited protrusions.

40. The electrostatic chuck of claim 36, wherein at least one protrusion of the plurality of protrusions comprises a substrate contacting surface coating over an underlying protrusion.

41. The electrostatic chuck of claim 40, wherein the substrate contacting surface coating comprises alumina deposited by atomic layer deposition.

42. The electrostatic chuck of claim 1, further comprising a diffusion barrier layer of amorphous alumina deposited by atomic layer deposition, disposed over the stack of dielectric layers.

43. The electrostatic chuck of claim 42, wherein the diffusion barrier layer has a thickness in a range of between 0.2 μm and 1 μm.

44. The electrostatic chuck of claim 42, further comprising a plurality of protrusions deposited over the diffusion barrier layer.

45. The electrostatic chuck of claim 44, wherein the plurality of protrusions deposited over the diffusion barrier layer comprise silicon oxide.

46. The electrostatic chuck of claim 1, wherein the insulator layer of amorphous alumina has a minimum dielectric strength of at least 200V per micron.

47. The electrostatic chuck of claim 46, wherein the insulator layer of amorphous alumina has a minimum dielectric strength of between 200V per micron and 400V per micron.

48. The electrostatic chuck of claim 46, wherein the insulator layer of amorphous alumina has a minimum dielectric strength of at least 500V per micron.

49. The electrostatic chuck of claim 46, wherein the insulator layer of amorphous alumina has a minimum dielectric strength of at least 800V per micron.

50. The electrostatic chuck of claim 1, wherein the at least one dielectric layer including aluminum oxynitride comprises a minimum dielectric strength of at least 50V per micron.

51. The electrostatic chuck of claim 1, wherein the at least one dielectric layer including at least one of silicon oxide and silicon oxynitride comprises silicon oxide comprising a minimum dielectric strength of at least 70V per micron.

52. The electrostatic chuck of claim 1, wherein the at least one dielectric layer including at least one of silicon oxide and silicon oxynitride comprises silicon oxynitride comprising a minimum dielectric strength of at least 70V per micron.

53. The electrostatic chuck of claim 1, further comprising a heater.

54. The electrostatic chuck of claim 53, wherein the heater comprises a resistive heater that is deposited and encapsulated at a rear side of the ceramic structural element.

55. The electrostatic chuck of claim 53, further comprising at least one embedded temperature sensor.

56. The electrostatic chuck of claim 1, comprising a rounded edge on at least one of: a gas hole; a gas channel; a lift pin hole; and a ground pin hole.

57. The electrostatic chuck of claim 1, wherein a substrate contacting surface of the electrostatic chuck comprises at least one of: alumina deposited by atomic layer deposition, silicon oxide, silicon nitride, silicon oxynitride and silicon-rich oxide.

58. The electrostatic chuck of claim 1, wherein the insulator layer of amorphous alumina comprises a porosity of less than 2 volume percent.

59. The electrostatic chuck of claim 1, wherein the insulator layer of amorphous alumina comprises a porosity of less than 1 volume percent.

60. The electrostatic chuck of claim 1, wherein the insulator layer of amorphous alumina comprises a porosity of less than 0.5 volume percent.

61. The electrostatic chuck of claim 1, wherein the insulator layer of amorphous alumina comprises alumina of formula $Al_xO_y$, where x is in the range of 1.8 to 2.2 and y is in the range of 2.6 to 3.4.

62. The electrostatic chuck of claim 1, wherein the at least one dielectric layer including aluminum oxynitride comprises aluminum oxynitride of formula $AlO_xN_y$, where x is in the range of 1.4 to 1.8 and y is in the range of 0.2 to 0.5.

63. The electrostatic chuck of claim 1, wherein the at least one dielectric layer including at least one of silicon oxide and silicon oxynitride comprises silicon oxide of formula $SiO_x$, where x is in the range of 1.8 to 2.4.

64. The electrostatic chuck of claim 1, wherein the at least one dielectric layer including at least one of silicon oxide and silicon oxynitride comprises silicon oxynitride of formula $SiO_xN_y$, where x is in the range of 1.6 to 2.0 and y is in the range of 0.1 to 0.5.

* * * * *